US005196230A

United States Patent [19]
Okonogi et al.

[11] Patent Number: 5,196,230
[45] Date of Patent: Mar. 23, 1993

[54] METHOD FOR CONNECTING AN ELECTROMAGNETIC WAVE SHIELDING LAYER WITH A GROUND CIRCUIT IN A PRINTED CIRCUIT BOARD

[75] Inventors: Hirotaka Okonogi; Katsutomo Nikaido; Junichi Ichikawa, all of Iruma, Japan

[73] Assignee: Nippon Cmk Corp., Japan

[21] Appl. No.: 657,456

[22] Filed: Feb. 19, 1991

[30] Foreign Application Priority Data

Apr. 18, 1990 [JP] Japan .................................. 2-102146

[51] Int. Cl.$^5$ ........................ B05D 5/12; H01Q 17/00
[52] U.S. Cl. ........................................ 427/96; 29/601; 174/264
[58] Field of Search ................ 427/96; 29/600, 601; 174/35 R, 255, 258

[56] References Cited

U.S. PATENT DOCUMENTS 4,789,760  12/1988  Koyama et al. .................. 174/264

OTHER PUBLICATIONS

Benjamin, C. E., High-Current Internal Contact Structure For ICs, IBM Technical Discl. Bull., vol. 19, No. 10, Mar. 1977.

Primary Examiner—P. W. Echols
Attorney, Agent, or Firm—Bruce L. Adams; Van C. Wilks

[57] ABSTRACT

A method for connecting a ground circuit and an electromagnetic wave shielding layer for a printed wiring circuit in a printed circuit board is disclosed. The method comprising the steps of forming said insulating layer by a plurality of insulating layers and gradually increasing from the printed wiring circuit side to the electromagnetic wave shielding layer side, a diameter of an aperture of the ground circuit of each insulating layer in the process for forming the insulating layer.

8 Claims, 1 Drawing Sheet

5,196,230

METHOD FOR CONNECTING AN ELECTROMAGNETIC WAVE SHIELDING LAYER WITH A GROUND CIRCUIT IN A PRINTED CIRCUIT BOARD

BACKGROUND OF THE INVENTION

The present invention relates to a method for connecting a ground circuit width an electromagnetic wave shielding layer of a printed wiring circuit in a printed circuit board having an electromagnetic wave shielding layer.

In a conventional printed circuit board, in order to avoid the circuit from malfunctioning between printed wiring circuits or external apparatus due to electromagnetic interference, it is proposed to shield the entire surface or the local portion of the above-mentioned printed wiring circuit by providing an electromagnetic wave shielding layer on the upper side of the printed wiring circuit via an insulating layer.

The electromagnetic wave shielding layer and the ground circuit of the printed wiring circuit is connected in the printed circuit board as shown in FIG. 2. That is, when an insulating layer 3 is formed on the upper side of a printed wiring circuit 2 formed on the whole surface of a base material board 1, a ground circuit terminal portion (hereinafter referred to as a ground terminal) 4 of the printed wiring circuit 2 has bored through its upper side a connecting portion (hereinafter referred to as a terminal) 5 whose aperture is the same as the aperture of the ground terminal 4. Thereafter, the connecting terminal 5 is formed to electrically connect an electromagnetic wave shielding layer 6 and the ground terminal 4 by a conductive material filled into the terminal 5 when the electromagnetic wave shielding layer 6 is formed on the upper side of the above-mentioned insulating layer 3. Then, the electromagnetic wave shielding layer 6 and the printed wiring circuit 2 are electrically connected by the connecting terminal 5.

While the electromagnetic wave shielding layer 6 and the ground terminal 4 are connected in the printed circuit board 7 through the connecting terminal 5 which is formed at the same time when the electromagnetic wave shielding layer 6 is formed, the electromagnetic wave shielding layer 6 is generally formed by coating a conductive paste by a silk screen printing process. There are then disadvantages because an electrical connection of the terminal 5 becomes defective and that the stability of the connecting of the terminal 5 becomes irregular.

More specifically, the area of the concave or recess portion of the connecting terminal 5 between the insulating layer 3 and the ground terminal 4 formed on the upper side of the printed wiring circuit 2 is limited and becomes a small space in accordance with the increased density of the wiring circuit. Thus, when the conductive paste is coated in the forming process of the electromagnetic wave shielding layer 6, the conductive paste is not smoothly filled into the connecting terminal 5 resulting in the formation of bubbles. Also, the edge of the opening portion hinders the conductive paste from being smoothly filled into the connecting terminal 5 which may result in an incomplete connection. As a consequence, a stable connection with the terminal 5 cannot be obtained.

SUMMARY OF THE INVENTION

An object of the present invention is to obviate the aforesaid defects encountered with the conventional connecting method for connecting the electromagnetic wave shielding layer and the ground circuit of the printed wiring circuit in the printed circuit board.

Another object of the present invention is to provide a connecting method by which the connection between the electromagnetic wave shielding layer and the ground circuit can be formed consistently stable.

According to the present invention, there is provided a connection method for connecting an electromagnetic wave shielding layer and a ground circuit in a printed circuit board in which the electromagnetic wave shielding layer is formed on the upper side of a printed wiring circuit formed on one surface or both surfaces of a substrate through an insulating layer and the ground circuit of the printed wiring circuit and the electromagnetic wave shielding layer are electrically connected. The method comprises the steps of forming the insulating layer by a plurality of insulating layers and gradually increasing from the printed wiring circuit side to the electromagnetic wave shielding layer side, a diameter of an aperture of the ground circuit of each insulating layer in the process for forming the insulating layer.

Accordingly, by the process for forming the insulating layer by the plurality of insulating layers in the terminal forming process and the process for gradually increasing the diameter of the aperture of the terminal in the process for forming each layer, the opening portion of the terminal is formed as an inverted trapezoidal configuration, whereby a conductive paste can be properly filled into the opening portion of the terminal when the conductive paste is coated on the terminal in the process for forming the electromagnetic wave shielding layer. Also, the occurrence of bubbles can be avoided and the conductive paste can be prevented from being filled into the opening portion of the terminal irregularly when the conductive paste is filled into the opening portion of the terminal.

According to the connection method for connecting the electromagnetic wave shielding layer and the ground circuit in the printed circuit board of the present invention, the electromagnetic wave shielding layer and the ground circuit can be always connected together in the stable condition, whereby the quality of the printed circuit board can be made uniform and the accuracy and durability of the circuit board is increased.

DETAILED DESCRIPTION OF THE INVENTION

Figure 1:
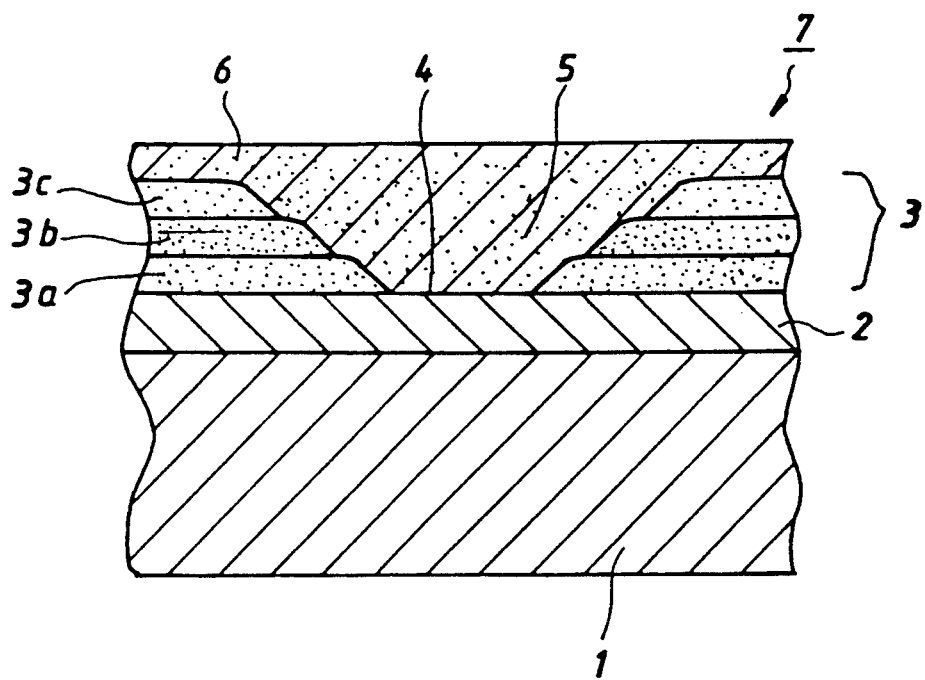
FIG. 1 is an explanatory diagram showing an embodiment of the present invention.
Figure 2:
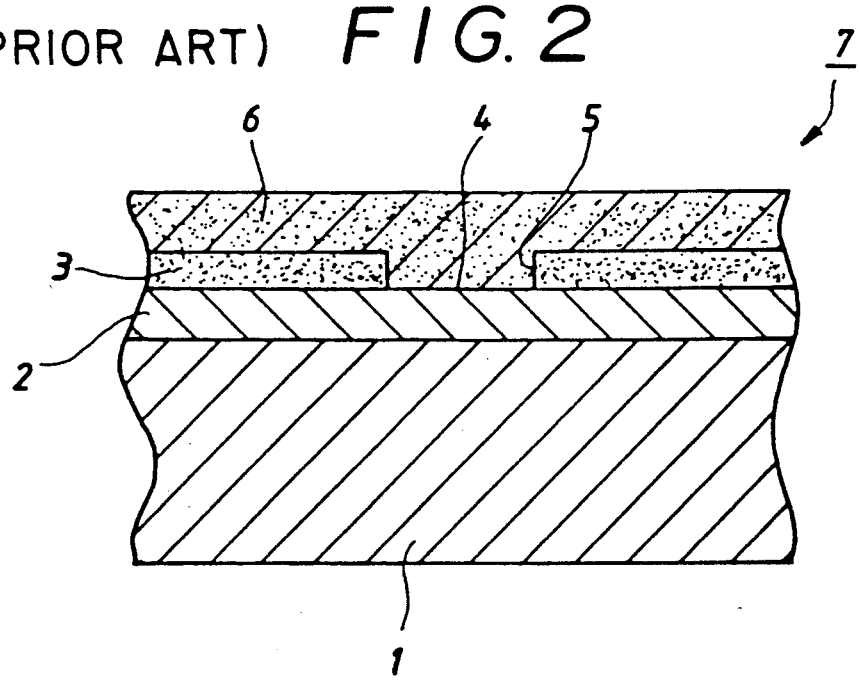
FIG. 2 is an explanatory diagram showing a conventional terminal.

An embodiment of the present invention will hereinafter be described with reference to the drawing.

FIG. 1 is an explanatory diagram showing an embodiment of the present invention.

Referring to the drawing, a printed circuit board 7 is comprised of a printed wiring circuit 2 of a predetermined pattern formed on a base material board 1, an insulating layer (hereinafter referred to as an underresist layer) 3 formed on the upper side of the printed wiring circuit 2 and an electromagnetic wave shielding layer 6 formed on the upper side of this underresist layer 3.

The electromagnetic wave shielding layer 6 and the ground terminal 4 of the printed wiring circuit 2 are electrically connected to each other by a terminal 5.

Accordingly, the connection of the electromagnetic wave shielding layer 6 to the ground terminal by the connecting terminal 5 is accomplished by the process for forming an opening portion of the terminal 5 in the forming process of the underresist layer 3 and a process for forming the terminal 5 by filling the conductive paste into the opening portion of the terminal 5 in the electromagnetic wave shielding layer 6.

Therefore, the forming process of the underresist layer 3 is comprised of steps for sequentially forming respective layers of underresist layers 3a, 3b and 3c. When the underresist 3a, 3b and 3c are formed, the diameter of the opening portion of the terminal 5 formed on the upper side of the ground terminal 4 of the printed wiring circuit 2 is gradually increased (e.g., the aperture of the lower underresist layer 3a is selected the same as that of the ground terminal 4, the aperture of the underresist layer 3b is made larger than the aperture of the ground terminal by 0.2 mm and the aperture of the underresist layer 3c is made larger than the former aperture by 0.2 mm) from the underresist layer 3a of the printed wiring circuit 2 side to the underresist layer 3c of the electromagnetic wave shielding layer 6 side (from the lower underresist layer 3a to the upper underresist layer 3c in the drawing). Thus, the opening portion of the terminal 5 formed of a concave portion of inverted trapezoidal configuration is formed over the ground terminal 4. In other words, the opening portion of the terminal is a tapered opening converging in the direction of the printed circuit 2.

While level differences are formed on the respective opening portions of the underresist layers 3a, 3b and 3c so as to form a stepped, tapered opening in the illustrated embodiment, the opening portion can be formed of inverted trapezoidal-shaped portion formed of a contiguous inclined surface having no level difference between the opening portions. Also, the number of layers forming the underresist layer 3 is not limited to the three layers in the illustrated embodiment, and this underresist layer may be formed of double layer or a plurality of layers of more than three layers.

The respective underresist layers 3a, 3b and 3c may be formed by the conventional methods, such as the silk screen printing process and the like.

Further, the electromagnetic wave shielding layer 6 is formed by coating a conductive paste having a thermosetting property or the like on the upper side of the aforesaid underresist layer 3 by the methods such as the silk screen printing method or the like.

Since the conductive paste is coated and then cured, the electromagnetic wave shielding layer 6 required by the printed wiring circuit 2 of the printed circuit board 7 can be formed. Also, when the aforesaid conductive paste is coated, the conductive paste is filled into the opening portion of the terminal 5 and the conductive paste is cured to form the terminal 5, thereby the electrical connection between the electromagnetic wave shielding layer 6 and the ground terminal 4 is completed. e Particularly, the aforesaid conductive paste is smoothly filled into the opening portion of the terminal 5 even when the area of the opening portion is limited because the opening portion is shaped as the inverted trapezoidal configuration. Thus, the shortage of the filled amount of the conductive paste can be avoided, the occurrence of bubbles can be avoided and the coating of the conductive paste can be prevented from being interrupted, thereby forming a stable connection.

While the present invention is applied to the single-sided printed circuit board in the embodiment, the present invention can be similarly applied to a doubled-sided printed circuit board or to a multilayer printed circuit board.

What is claimed is:

1. A method for connecting an electromagnetic wave shielding layer with a ground circuit in a printed circuit board in which the electromagnetic wave shielding layer is formed over a printed wiring circuit formed on at least one surface of a base material board through an insulating layer and the ground circuit of the printed wiring circuit and the electromagnetic wave shielding layer are electrically connected, the method comprising the steps of: forming said insulating layer by forming a plurality of insulating layers and gradually increasing, from the printed wiring circuit side to the electromagnetic wave shielding layer side, a diameter of an aperture of each insulating layer in the process of forming the insulating layer.

2. A method for connecting an electromagnetic wave shielding layer with a ground circuit in a printed circuit board according to claim 1, wherein said insulating layer is formed of at least three insulating layers.

3. A method for connecting an electromagnetic wave shielding layer with a ground circuit in a printed circuit board according to claim 1, wherein the diameters of said apertures in said insulating layers are determined such that a difference between the aperture diameters in each two adjacent layers is 0.2 mm.

4. A method of connecting an electromagnetic wave shielding layer with a printed circuit of a printed circuit board, comprising the steps of:
   providing a substrate;
   forming a printed circuit on at least one surface of the substrate;
   forming an insulative layer on the printed circuit having at least one connecting region which has a tapered opening converging in the direction of the printed circuit; and
   forming an electromagnetic wave shielding layer on the insulative layer having a terminal portion connected with the printed circuit through said at least one connecting region.

5. A method of connecting an electromagnetic wave shielding layer with a printed circuit of a printed circuit board according to claim 4; wherein the step of forming the insulative layer comprises forming a succession of insulative layers one atop the other with increasingly larger apertures to define the tapered opening.

6. A method of connecting an electromagnetic wave shielding layer with a printed circuit of a printed circuit board according to claim 5; wherein the succession of insulative layers are formed so that the apertures thereof define a stepped-tapered opening converging in the direction of the printed circuit layer.

7. A method of connecting an electromagnetic wave shielding layer with a printed circuit of a printed circuit board according to claim 6; wherein each successively formed insulative layer has an aperture having a diameter about 0.2 millimeters larger than that of the previously formed insulative layer.

8. A method of connecting an electromagnetic wave shielding layer with a printed circuit of a printed circuit board according to claim 5; wherein the insulative layer is formed of three successively formed insulative layers.

* * * * *